(12) United States Patent
Her et al.

(10) Patent No.: US 10,790,034 B2
(45) Date of Patent: Sep. 29, 2020

(54) MEMORY DEVICE GENERATING STATUS SIGNAL, MEMORY SYSTEM INCLUDING THE MEMORY DEVICE, AND METHOD OF OPERATING MEMORY DEVICE

(71) Applicant: SK hynix Inc., Icheon-si, Gyeonggi-do (KR)

(72) Inventors: Min Ho Her, Cheongju-si (KR); Seung Il Kim, Cheongju-si (KR); Yong Ho Kim, Cheongju-si (KR); Jae Min Lee, Cheongju-si (KR); Seon Young Choi, Cheongju-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 158 days.

(21) Appl. No.: 16/128,239

(22) Filed: Sep. 11, 2018

(65) Prior Publication Data
US 2019/0304557 A1    Oct. 3, 2019

(30) Foreign Application Priority Data
Apr. 3, 2018    (KR) ........................ 10-2018-0038859

(51) Int. Cl.
| | |
|---|---|
| *G11C 16/00* | (2006.01) |
| *G11C 29/52* | (2006.01) |
| *G06F 11/10* | (2006.01) |
| *G11C 16/10* | (2006.01) |
| *G11C 16/34* | (2006.01) |
| *G11C 16/26* | (2006.01) |
| *G11C 11/56* | (2006.01) |

(52) U.S. Cl.
CPC ...... *G11C 16/3459* (2013.01); *G06F 11/1068* (2013.01); *G11C 16/10* (2013.01); *G11C 16/26* (2013.01); *G11C 29/52* (2013.01); *G11C 11/5628* (2013.01)

(58) Field of Classification Search
None
See application file for complete search history.

(56) References Cited

U.S. PATENT DOCUMENTS 9,214,239 B2 *  12/2015  Jung ..................... G11C 16/107
10,180,873 B2 *  1/2019  Yoo ........................ G06F 11/079
(Continued)

FOREIGN PATENT DOCUMENTS

| KR | 1020120030281 A | 3/2012 |
| KR | 1020120098079 A | 9/2012 |
| KR | 1020160060917 A | 5/2016 |

*Primary Examiner* — Justin R Knapp
(74) *Attorney, Agent, or Firm* — William Park & Associates Ltd.

(57) ABSTRACT

Provided herein may be a memory device, a memory system having the memory device, and a method of operating the memory device. The memory device may include a memory cell array configured to store data, a peripheral circuit configured to perform a program operation on the memory cell array, and a control logic configured to perform the program operation by controlling the peripheral circuit and to perform a status check operation after the program operation. Here, the control logic may be configured to, based on a determination that the status check operation has passed, perform a number-of-program pulses comparison operation by comparing a number of program pulses used in the program operation to a first preset range.

20 Claims, 9 Drawing Sheets

(56) References Cited

U.S. PATENT DOCUMENTS

| | | | |
|---|---|---|---|
| 10,249,382 B2 * | 4/2019 | Lee | G11C 29/44 |
| 2018/0157546 A1 * | 6/2018 | Yoo | G11C 29/12 |
| 2019/0051359 A1 * | 2/2019 | Yoo | G11C 16/3459 |
| 2019/0287635 A1 * | 9/2019 | Lee | G11C 16/10 |

* cited by examiner

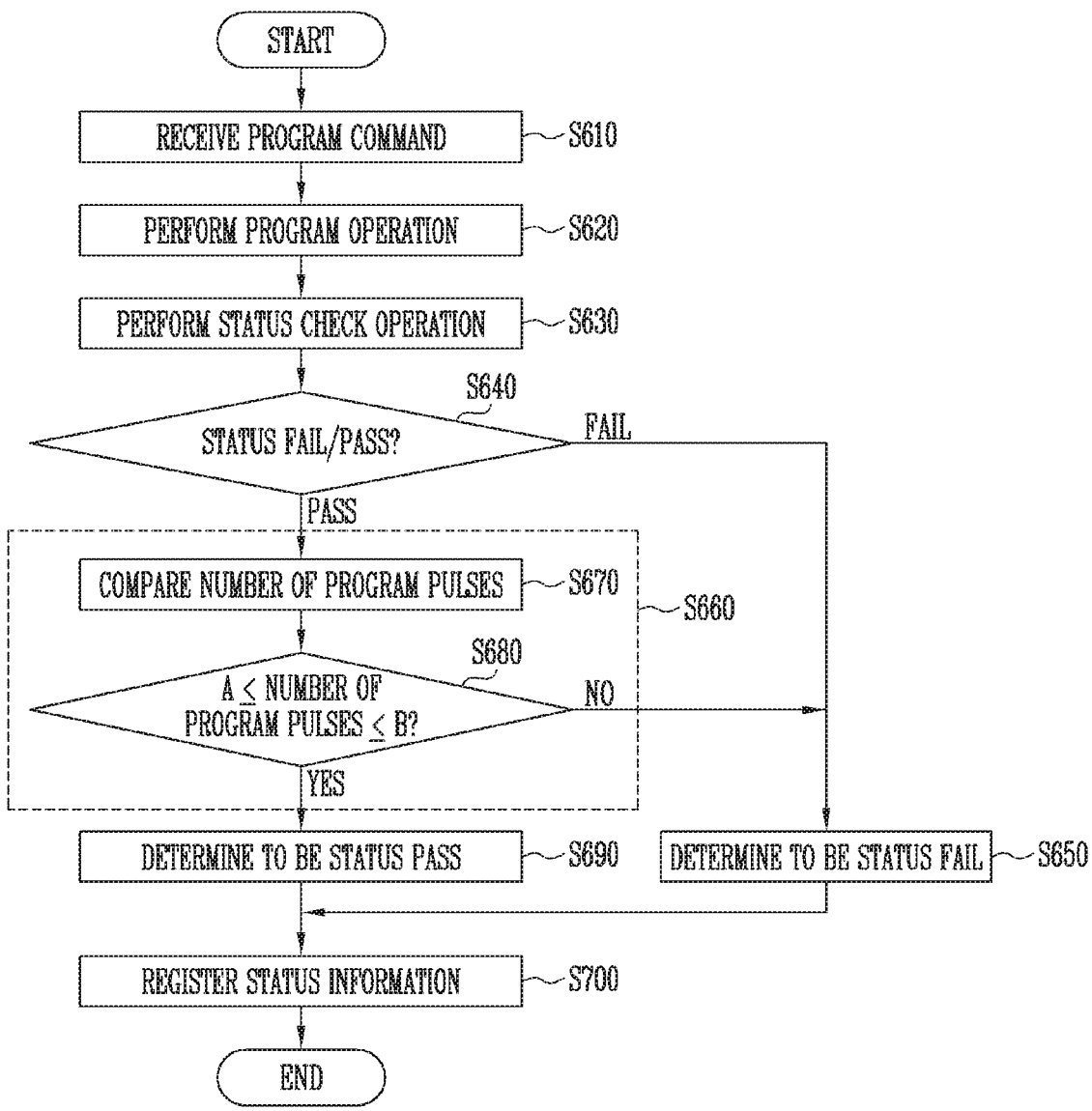

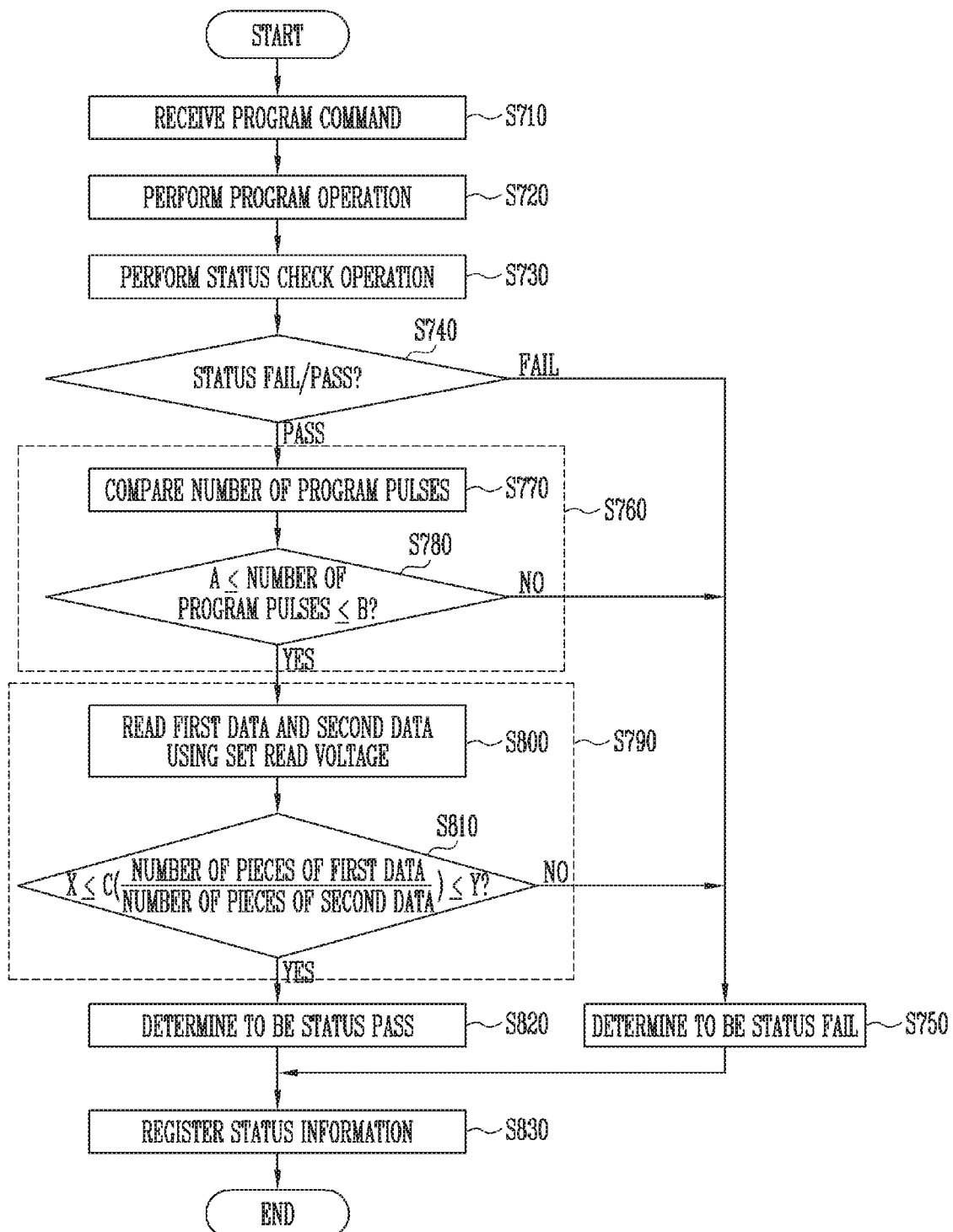

MEMORY DEVICE GENERATING STATUS SIGNAL, MEMORY SYSTEM INCLUDING THE MEMORY DEVICE, AND METHOD OF OPERATING MEMORY DEVICE

CROSS-REFERENCE TO RELATED APPLICATION

The present application claims priority under 35 U.S.C. § 119(a) to Korean patent application number 10-2018-0038859 filed on Apr. 3, 2018, in the Korean Intellectual Property Office, the entire disclosure of which is incorporated herein by reference.

BACKGROUND

1. Technical Field

Various embodiments of the present disclosure generally relate to a memory device, a memory system having the memory device, and a method of operating the memory device.

2. Related Art

Recently, the paradigm for a computer environment has been converted into ubiquitous computing so that computer systems can be used anytime and anywhere. Due to this, the use of portable electronic devices such as mobile phones, digital cameras, and notebook computers has rapidly increased. In general, such portable electronic devices use a memory system which employs a memory device, in other words, use a data storage device. The data storage device is used as a main memory device or an auxiliary memory device for portable electronic devices.

A data storage device using a memory device provides advantages in that, since there is no mechanical driving part, stability and durability are excellent, an information access speed is very high, and power consumption is low. Data storage devices, as an example of the memory system having such advantages, include a universal serial bus (USB) memory device, memory cards having various interfaces, a solid state drive (SSD), etc.

SUMMARY

An embodiment of the present disclosure may provide for a memory device. The memory device may include a memory cell array configured to store data, a peripheral circuit configured to perform a program operation on the memory cell array, and a control logic configured to perform the program operation by controlling the peripheral circuit and to perform a status check operation after the program operation. Here, the control logic may be configured to, based on a determination that the status check operation has passed, perform a number-of-program pulses comparison operation by comparing a number of program pulses used in the program operation to a first preset range.

An embodiment of the present disclosure may provide for a memory system. The memory system may include a memory device configured to perform a program operation. The memory system may include a memory controller configured to control the program operation of the memory device and to receive status information pertaining to the program operation. The memory device may be configured to generate the status information by performing a status check operation and a number-of-program pulses comparison operation for the program operation.

An embodiment of the present disclosure may provide for a method of operating a memory device. The method may include performing a program operation, performing a status check operation for the program operation, and performing a number-of-program pulses comparison operation of, when a result of the status check operation is determined to be a pass, determining whether a number of program pulses used in the program operation is within or out of a first preset range.

BRIEF DESCRIPTION OF THE DRAWINGS

FIG. 6 is a flowchart illustrating a method of operating a memory system according to an embodiment of the present disclosure.

FIG. 7 is a flowchart illustrating a method of operating a memory system according to an embodiment of the present disclosure.

DETAILED DESCRIPTION

The technical spirit of the present disclosure may be changed in various manners, and may be implemented as embodiments having various aspects. Hereinafter, the present disclosure will be described by way of some embodiments so that those skilled in the art can easily practice the embodiments of the present disclosure.

It will be understood that, although the terms "first" and/or "second" may be used herein to describe various elements, these elements should not be limited by these terms. These terms are only used to distinguish one element, from another element. For instance, a first element discussed below could be termed a second element without departing from the teachings of the present disclosure. Similarly, the second element could also be termed the first element.

It will be understood that when an element is referred to as being "coupled" or "connected" to another element, it can be directly coupled or connected to the other element or intervening elements may be present therebetween. In contrast, it should be understood that when an element is referred to as being "directly coupled" or "directly connected" to another element, there are no intervening elements present. Other expressions that explain the relationship between elements, such as "between", "directly between", "adjacent to" or "directly adjacent to" should be construed in the same way.

The terminology used herein is for the purpose of describing particular embodiments only and is not intended to be limiting. In the present disclosure, the singular forms are intended to include the plural forms as well, unless the context clearly indicates otherwise. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof.

Various embodiments of the present disclosure may be directed to a memory device, a memory system having the memory device, and a method of operating the memory device, which can determine the result of a final status check using the number of program pulses used in a program operation of the memory device.

Figure 1:
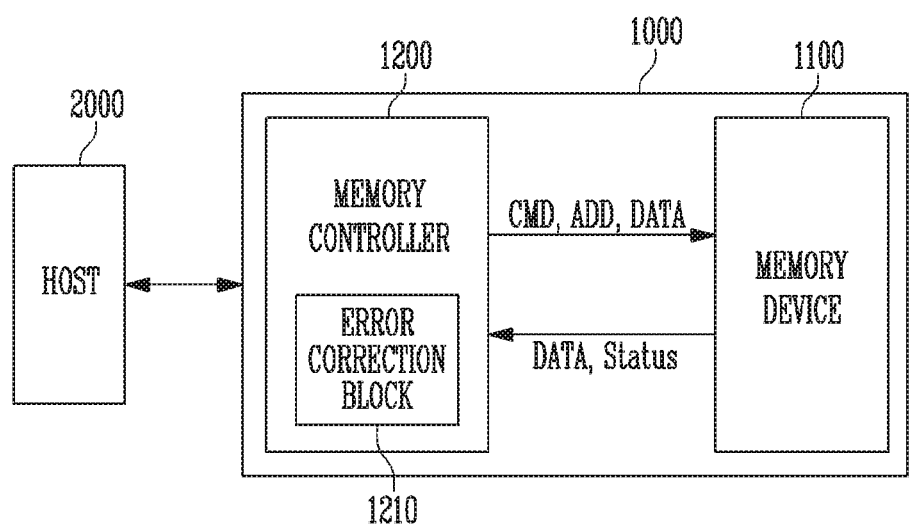
FIG. 1 is a diagram illustrating a memory system according to an embodiment of the present disclosure.

FIG. 1 is a diagram illustrating a memory system according to an embodiment of the present disclosure.

Referring to FIG. 1, a memory system 1000 may include a memory device 1100 which stores data, and a memory controller 1200 which controls the memory device 1100 under the control of a host 2000.

The host 2000 is capable of communicating with the memory system 1000 using an interface protocol, such as Peripheral Component Interconnect-Express (PCI-E), Advanced Technology Attachment (ATA), Serial ATA (SATA), Parallel ATA (PATA) or Serial Attached SCSI (SAS). In addition, the interface protocol between the host 2000 and the memory system 1000 is not limited to the above-described examples, and may be one of various interface protocols such as Universal Serial Bus (USB), Multi-Media Card (MMC), Enhanced Small Disk Interface (ESDI), and Integrated Drive Electronics (IDE) interface protocols.

The memory device 1100 is operated in response to the control of the memory controller 1200. In an embodiment, the memory device 1100 may be a flash memory device. The memory device 1100 may include a memory cell array including a plurality of memory blocks.

The memory device 1100 may receive a command CMD and addresses ADD from the memory controller 1200 through a channel, and may access an area, selected by the address ADD, in the memory cell array. That is, the memory device 1100 performs an internal operation corresponding to the command CMD on the area selected by the address ADD. For example, the memory device 1100 may perform a program operation on a selected memory block in response to the command CMD, addresses ADD, and data DATA which correspond to the program operation. Further, the memory device 1100 may perform a status check operation after the program operation has been completed, and may output the result of the status check operation as a status signal to the memory controller 1200.

The memory controller 1200 may control the overall operation of the memory system 1000, and may control data exchange between the host 2000 and the memory device 1100. For example, the memory controller 1200 may program data, read data or erase programmed data by controlling the memory device 1100 in response to a request received from the host 2000. For example, the memory controller 1200 may output the command CMD, addresses ADD, and data DATA corresponding to the overall operation to the memory device 1100 in response to a request received from the host 2000, and may receive data DATA from the memory device 1100 and output the data to the host 2000. Further, when the command CMD and data DATA corresponding to the program operation are received from the host 2000, the memory controller 1200 may randomize the data DATA, and may output the randomized data to the memory device 1100. For example, when the memory device 1100 is programmed in a Multi-Level Cell (MLC) type, the memory controller 1200 may randomize the data DATA received from the host 2000, and may convert the received data into random data in which first data to fourth data (00, 01, 10, 11) have an equal number of bits. Further, when the memory device 1100 is programmed in a Triple-Level Cell (TLC) type, the memory controller 1200 may randomize the data DATA received from the host 2000, and may convert the received data into random data in which first data to eighth data (000, 001, 010, 011, 100, 101, 110, 111) have an equal number of bits.

The memory controller 1200 may receive a status signal from the memory device 1100, and may determine and store the status of the plurality of memory blocks included in the memory device 1100 based on the status signal. For example, the memory controller 1200 may store status information of the plurality of memory blocks included in the memory device 1100 based on the status signal, and may determine that each of the memory blocks is a normal memory block or a bad block depending on the status information. Each memory block determined to be a bad block has a strong possibility that an error will occur in a next overall operation, and thus the memory block may be excluded from selection in the next overall operation.

The memory controller 1200 may be configured to include an error correction block 1210. The error correction block 1210 may detect and correct errors in the data DATA received from the memory device 1100. An error correction function performed by the error correction block 1210 is limited by the number of error bits contained in the data received from the memory device 1100. When the number of error bits contained in the data received from the memory device is less than a specific value, the error correction block 1210 performs an error detection and correction function. When the number of error bits contained in the data received from the memory device 1100 is greater than a specific value, the error detection and correction function cannot be performed, and the overall operation of the memory device 1100 may fail. The number of the above-described error bits may increase when a next overall operation is performed after the program operation, and may increase when the next overall operation is performed in a case where the number of program pulses in the program operation falls out of a preset range. The reason for this is that, when the memory cells included in the memory device 1100 are vulnerable memory cells, the memory cells may be programmed by the number of program pulses falling out of the preset range.

The word "preset" as used herein with respect to a parameter, such as a preset range, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

Figure 2:
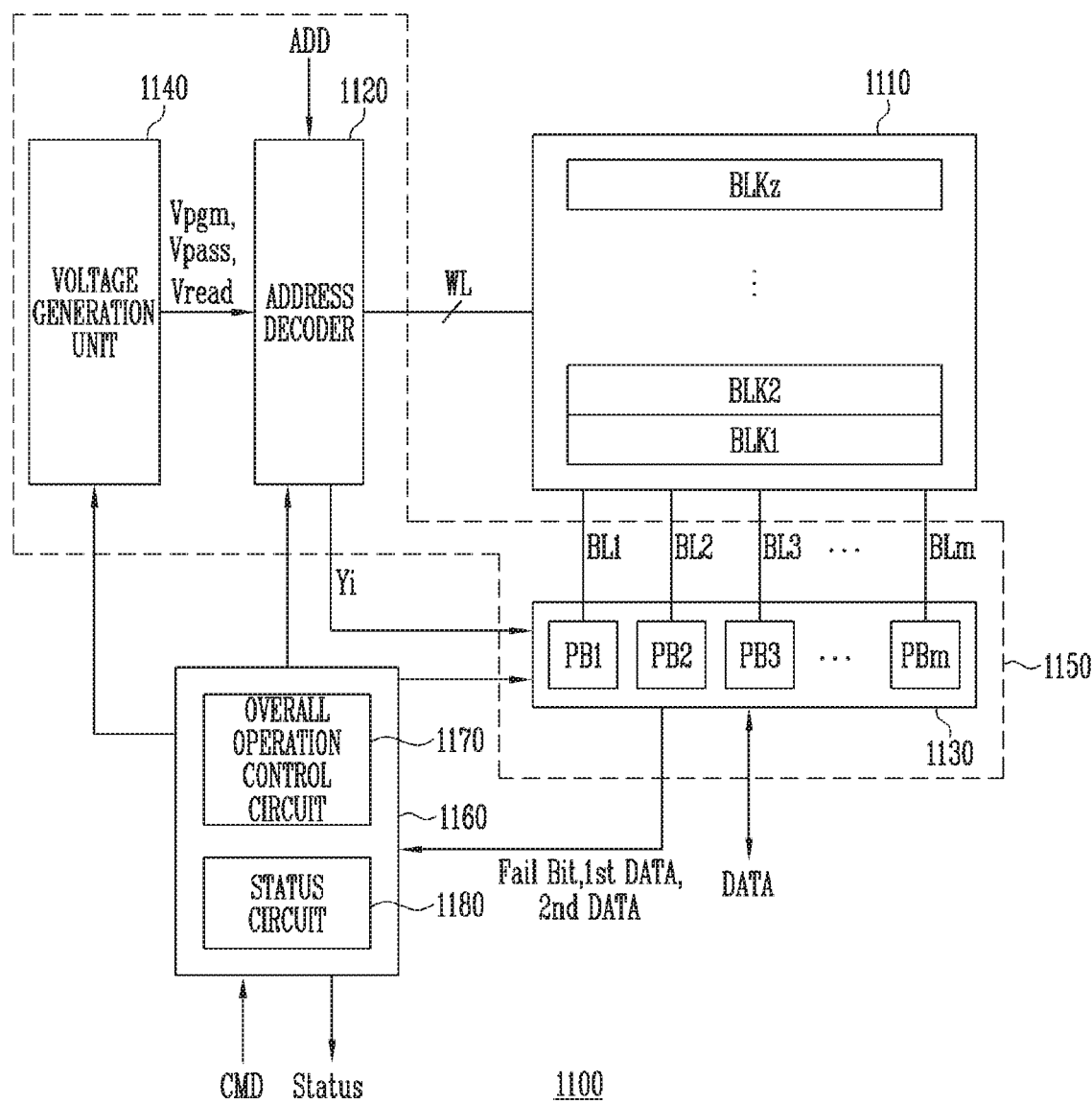
FIG. 2 is a diagram illustrating a memory device of FIG. 1.

FIG. 2 is a diagram illustrating the memory device of FIG. 1.

Referring to FIG. 2, the memory device 1100 may include a memory cell array 1110 in which data is stored. The memory device 1100 may include a peripheral circuit 1150 configured to perform a program operation for storing data in the memory cell array 1110, a read operation for outputting stored data, a status check operation for checking the status of memory blocks BLK1 to BLKz included in the memory cell array 1110, and an erase operation for erasing stored data. Further, the memory device 1100 may perform an operation of comparing the number of program pulses and an operation of comparing the number of pieces of data depending on the result of the status check operation.

The memory device 1100 may include a control logic 1160 which controls the peripheral circuit 1150 under the control of a memory controller (e.g., 1200 of FIG. 1).

The memory cell array 1110 may include the plurality of memory blocks BLK1 to BLKz (where z is a positive integer). The memory blocks BLK1 to BLKz are coupled to an address decoder 1120 through word lines WL. The memory blocks BLK1 to BLKz are coupled to a read and write circuit 1130 through bit lines BL1 to BLm (where m is a positive integer). Each of the memory blocks BLK1 to BLKz includes a plurality of memory cells. In an embodiment, the plurality of memory cells may be nonvolatile memory cells.

In some embodiments, the peripheral circuit 1150 may include the address decoder 1120, the read and write circuit 1130, and a voltage generation unit 1140. In other embodiments, the peripheral circuit 1150 may include the address decoder 1120, the read and write circuit 1130, and a voltage generation unit 1140, and the control logic.

The address decoder 1120 is coupled to the memory cell array 1110 through the word lines WL. The address decoder 1120 may be operated under the control of the control logic 1160. The address decoder 1120 receives addresses ADD through an input/output buffer (not illustrated) provided in the memory device 1100. The addresses ADD are provided from the memory controller (e.g., 1200 of FIG. 1).

During a program operation, the address decoder 1120 may decode a row address, among the received addresses ADD, apply a program voltage Vpgm, generated by the voltage generation unit 1140, to a word line selected from among the plurality of word lines WL in response to the decoded row address, and apply a pass voltage Vpass to remaining word lines, that is, unselected word lines. Further, during a read operation, the address decoder 1120 may decode a row address, among the received addresses ADD, apply a read voltage Vread, generated by the voltage generation unit 1140, to a word line selected from among the plurality of word lines WL in response to the decoded row address, and apply the pass voltage Vpass to remaining word lines, that is, unselected word lines.

The address decoder 1120 may decode a column address, among the received addresses ADD. The address decoder 1120 transmits a decoded column address Yi to the read and write circuit 1130.

The program and read operations of the memory device 1100 are each performed on a page basis. The addresses ADD, received when each of the read and program operations is requested, may include a block address, a row address, and a column address. The address decoder 1120 may select one memory block and one word line in accordance with the block address and the row address. The column address may be decoded by the address decoder 1120, and may then be provided to the read and write circuit 1130.

The read and write circuit 1130 may include a plurality of page buffers PB1 to PBm (where m is a positive integer). The plurality of page buffers PB1 to PBm are coupled to the memory cell array 1110 through the bit lines BL1 to BLm, respectively. Each of the page buffers PB1 to PBm may temporarily store data DATA to be programmed to memory cells in a program operation, and may control the potential of a corresponding one of the bit lines BL1 to BLm in accordance with the temporarily stored data. Each of the page buffers PB1 to PBm may sense the potential of the corresponding one of the bit lines BL1 to BLm during the read operation, and may then read and output the data DATA. The read and write circuit 1130 may check the programmed states of memory cells included in a selected page of a selected memory block during a status check operation performed after the program operation, and may output the number of memory cells on which the program operation has failed, as fail bits, to the control logic 1160. During the number-of-pieces of data comparison operation of comparing the numbers of pieces of first data and pieces of second data in the selected page of the selected memory block, on which the program operation has been completed, with each other after the status check operation, the read and write circuit 1130 may sense the potentials of corresponding bit lines BL1 to BLm and then output the pieces of first data (1st DATA) and the pieces of second data (2nd DATA) to the control logic 1160. The read and write circuit 1130 may be operated in response to control of the control logic 1160.

The voltage generation unit 1140 may generate the program voltage Vpgm and the pass voltage Vpass required for the program operation. Also, the voltage generation unit 1140 may generate the read voltage Vread and the pass voltage Vpass required for the read operation. The program voltage Vpgm is outputted in the form of multiple pulses which are gradually increased by a step voltage. That is, during the program operation, multiple program voltages which are gradually increased by the step voltage are sequentially generated depending on an Incremental Step Pulse Program (ISPP) scheme.

The control logic 1160 is coupled to the address decoder 1120, the read and write circuit 1130, and the voltage generation unit 1140. The control logic 1160 may control the overall operation of the memory device 1100 in response to a command CMD received from the memory controller (e.g., 1200 of FIG. 1).

The control logic 1160 may include an overall operation control circuit 1170 and a status circuit 1180.

The overall operation control circuit 1170 may control the peripheral circuits 1150 in response to the command CMD received from the memory controller (e.g., 1200 of FIG. 1). For example, when the command CMD corresponding to the program operation is received, the overall operation control circuit 1170 may perform the program operation on the memory cell array 1110 by controlling the peripheral circuits 1150, whereas when the command CMD corresponding to the read operation is received, the overall operation control circuit 1170 may perform the read operation on the memory cell array 1110 by controlling the peripheral circuits 1150.

After the program operation has been completed, the status circuit 1180 may perform a status check operation, an operation of comparing the number of pulses (hereinafter also referred to as "the number-of-pulses comparison operation"), and an operation of comparing the number of pieces of data (hereinafter also referred to as "the number-of-pieces of data comparison operation") on the memory cell array 1110, may generate a status signal Status for the selected memory block, and may output the status signal Status to the memory controller (e.g., 1200 of FIG. 1).

Figure 3:
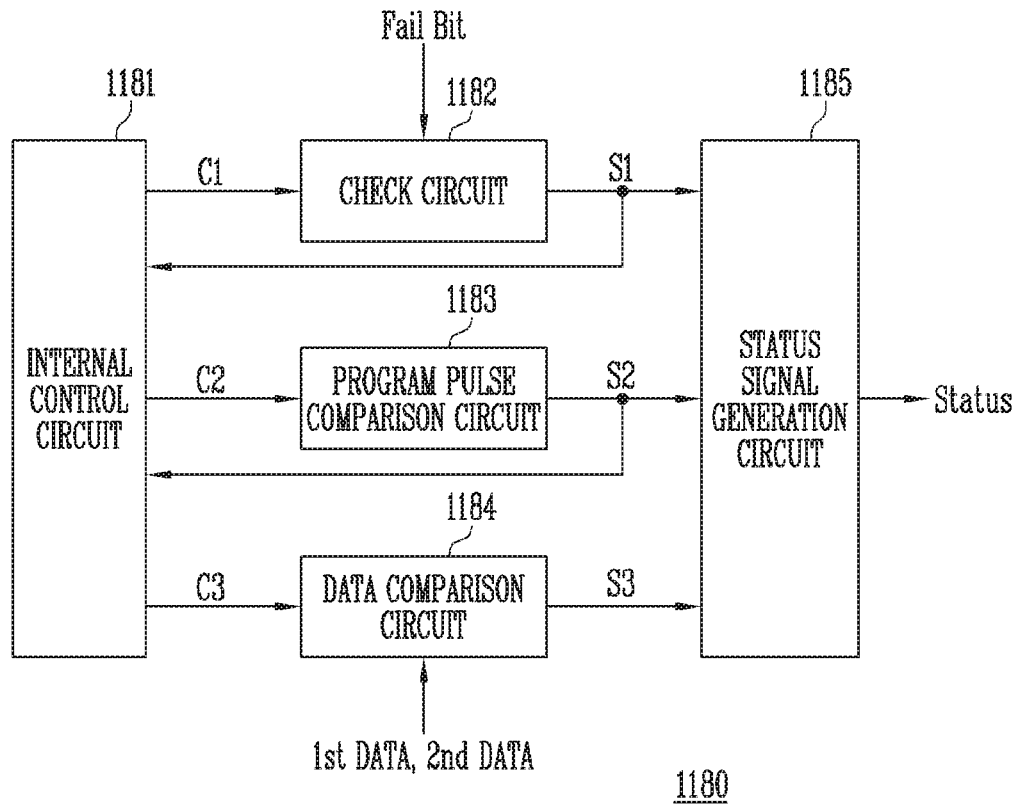
FIG. 3 is a diagram illustrating a status circuit of FIG. 2.

FIG. 3 is a diagram illustrating the status circuit of FIG. 2.

Referring to FIG. 3, the status circuit 1180 may include an internal control circuit 1181, a check circuit 1182, a program pulse comparison circuit 1183, a data comparison circuit 1184, and a status signal generation circuit 1185.

The internal control circuit 1181 may output a first control signal C1 for controlling the check circuit 1182 after a program operation has been completed, and may then control the check circuit 1182 to perform a status check operation on a selected page of a selected memory block on which the program operation has been completed. When it is determined, based on a first sub-signal S1 outputted from the check circuit 1182, that the result of the status check operation is a pass, the internal control circuit 1181 may output a second control signal C2 for controlling the program pulse comparison circuit 1183, and may then control the program pulse comparison circuit 1183 to determine whether the number of program pulses that are used in the program operation performed on the selected page falls within a preset range or falls out of the preset range. When it is determined, based on a second sub-signal S2 outputted from the program pulse comparison circuit 1183, that the number of program pulses used in the program operation falls within the preset range, the internal control circuit 1181 may output a third control signal C3 for controlling the data comparison circuit 1184, and may then control the data comparison circuit 1184 to determine whether a ratio of first data and second data, which are read from the selected page using a set read voltage, falls within or out of a preset range.

The check circuit 1182 may perform the status check operation in response to the first control signal C1 outputted from the internal control circuit 1181. The status check operation is performed such that the number of fail bits in the selected page of the selected memory block, on which the program operation has been completed, that is, the number of memory cells in which a program error occurs, is counted, and such that, when the counted number of fail bits is greater than the maximum allowable number of bits for error checking and correcting or error correcting code (ECC) that can be corrected using the error correction block (e.g., 1210 of FIG. 1), the status check operation is determined to have failed, whereas when the counted number of fail bits is less than or equal to the maximum allowable number of bits for ECC, the status check operation is determined to have passed. The check circuit 1182 outputs the first sub-signal S1 indicating a fail or pass result. The maximum allowable number of bits for ECC may be set in response to a request received from a host (e.g., 2000 of FIG. 1).

The program pulse comparison circuit 1183 may perform the operation of comparing the number of program pulses in response to the second control signal C2 outputted from the internal control circuit 1181. The program pulse comparison circuit 1183 may determine whether the number of program pulses that are used in the program operation, performed on the selected page of the selected memory block on which the program operation has been completed, falls within or out of a preset range, and may generate and output the second sub-signal S2 depending on the result of the determination. The preset range may be set based on the number of program pulses applied in a normal program operation, and may be, for example, a range from 15 to 20.

The data comparison circuit 1184 may perform the number-of-pieces of data comparison operation of comparing the number of pieces of first data (1st DATA) with the number of pieces of second data (2nd DATA) in response to the third control signal C3 outputted from the internal control circuit 1181. The data comparison circuit 1184 may determine whether the ratio of the first data (1st DATA) to second data (2nd DATA), which are read using a set read voltage from the selected page of the selected memory block on which the program operation has been completed, falls within or out of a preset range, and may generate and output a third sub-signal S3 depending on the result of the determination. The preset range may be, for example, a range in which the ratio of the first data to the second data ranges from 4:6 to 6:4

The status signal generation circuit 1185 may generate a status signal Status (i.e., including status information) based on the first sub-signal S1 outputted from the check circuit 1182, the second sub-signal S2 outputted from the program pulse comparison circuit 1183, and the third sub-signal S3 outputted from the data comparison circuit 1184, and may output the status signal Status to the memory controller (e.g., 1200 of FIG. 1). For example, when the status check operation is determined to have passed, and when the number of program pulses is determined to fall within the preset range as a result of the number-of-program pulses comparison operation and when the ratio of the first data to the second data is determined to fall within the preset range as a result of the number-of-pieces of data comparison operation, based on the first sub-signal S1, the second sub-signal S2, and the third sub-signal S3, respectively, the status signal generation circuit 1185 may determine that a status pass occurs, and may generate and output a status signal Status corresponding to the status pass. When the status check operation is determined to have failed, and when the number of program pulses is determined to fall out of the preset range as a result of the number-of-program pulses comparison operation or when the ratio of the first data to the second data is determined to fall out of the preset range as a result of the number-of-pieces of data comparison operation, based on the first sub-signal S1, the second sub-signal S2, and the third sub-signal S3, respectively, the status signal generation circuit 1185 may determine that a status fail occurs, and may generate and output a status signal Status corresponding to the status fail. For example, when the status check operation is determined to have passed and when the number of program pulses is determined to fall within the preset range as a result of the number-of-program pulses comparison operation, based on the first sub-signal S1 and the second sub-signal S2, respectively, the status signal generation circuit 1185 may determine that a status pass occurs, and may generate and output a status signal Status corresponding to the status pass. When the status check operation is determined to have failed or when the number of program pulses is determined to fall out of the preset range as a result of the number-of-program pulses comparison operation, based on the first sub-signal S1 and the second sub-signal S2, respectively, the status signal generation circuit 1185 may determine that a status fail occurs, and may generate and output a status signal Status corresponding to the status fail.

Figure 4:
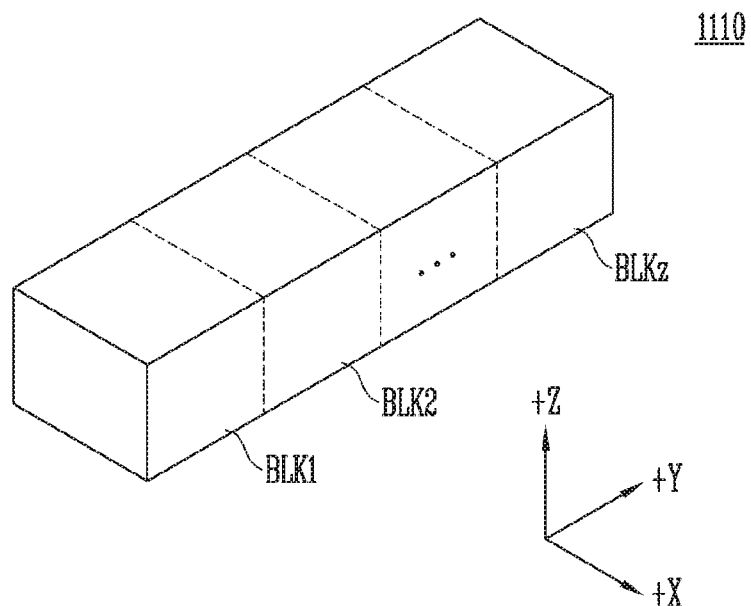
FIG. 4 is a block diagram illustrating an embodiment of a memory cell array of FIG. 2.

FIG. 4 is a block diagram illustrating an embodiment of the memory cell array of FIG. 2.

Referring to FIG. 4, the memory cell array 1110 includes a plurality of memory blocks BLK1 to BLKz. Each memory block has a three-dimensional (3D) structure. Each of the memory blocks may include a plurality of memory cells stacked on a substrate. The plurality of memory cells are arranged in +X, +Y, and +Z directions. The structure of each memory block will be described in below with reference to FIG. 5.

Figure 5:
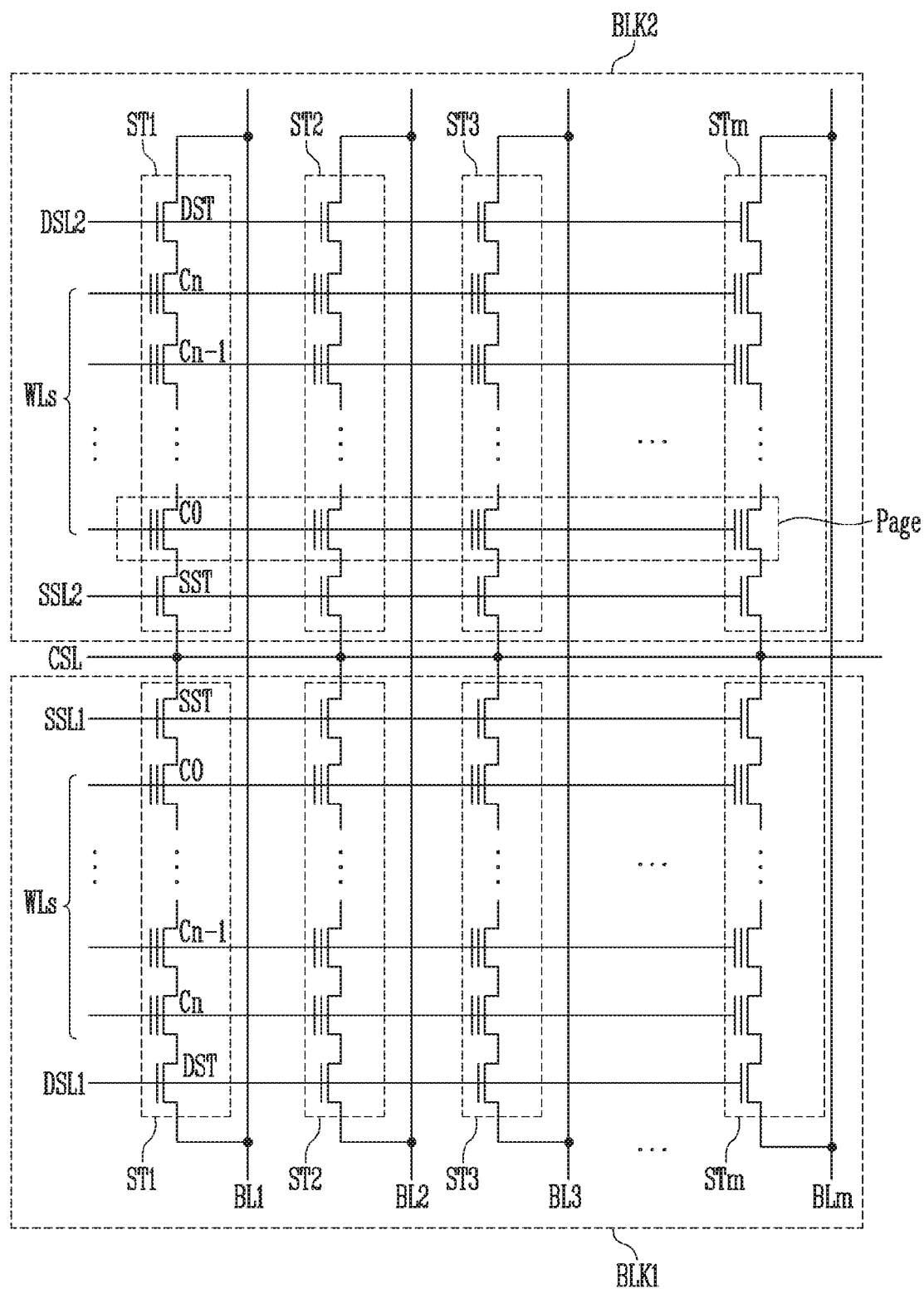
FIG. 5 is a circuit diagram illustrating a memory block of FIG. 4.

FIG. 5 is a circuit diagram illustrating the memory block of FIG. 4.

Although, in FIG. 4, the memory cell array may be configured to include a plurality of memory blocks BLK1 to BLKz, only the memory block BLK1 and the memory block BLK2 are representatively illustrated in FIG. 5 for convenience of illustration and description. The memory block BLK1 and the memory block BLK2 have a structure for sharing bit lines BL1 to BLm and a common source line CSL.

Referring to FIG. 5, the memory block BLK1 and the memory block BLK2 are coupled to the bit lines BL1 to BLm.

The memory block BLK1 includes a plurality of cell strings ST1 to STm. The plurality of cell strings ST1 to STm are respectively coupled between the plurality of bit lines BL1 to BLm and the common source line CSL. Each of the cell strings ST1 to STm includes a source select transistor SST, a plurality of series-coupled memory cells C0 to Cn, and a drain select transistor DST. The source select transistor SST is coupled to a source select line SSL1. The plurality of memory cells C0 to Cn are coupled to word lines WLs, respectively. The drain select transistor DST is coupled to a drain select line DSL1. The common source line CSL is coupled to a source of the source select transistor SST. Each of the bit lines BL1 to BLm is coupled to a drain of the corresponding drain select transistor DST. Memory cells coupled to the same word line are defined as one page.

The memory block BLK2 may be configured to have the same structure as the memory block BLK1. That is, the memory block BLK2 includes a plurality of cell strings ST1 to STm, and the plurality of cell strings ST1 to STm are respectively coupled between the plurality of bit lines BL1 to BLm and the common source line CSL. Each of the cell strings ST1 to STm includes a source select transistor SST, a plurality of series-coupled memory cells C0 to Cn, and a drain select transistor DST. The source select transistor SST is coupled to a source select line SSL2. The plurality of memory cells C0 to Cn are coupled to word lines WLs, respectively. The drain select transistor DST is coupled to a drain select line DSL2. The common source line CSL is coupled to a source of the source select transistor SST. Each of the bit lines BL1 to BLm is coupled to a drain of the corresponding drain select transistor DST.

As described above, the memory block BLK1 and the memory block BLK2 may be configured to have a similar structure, and the drain select lines DSL1 and DSL2 and the source select lines SSL1 and SSL2 coupled to the memory blocks BLK1 and BLK2, respectively, may be designed to be electrically isolated from each other.

FIG. 6 is a flowchart illustrating a method of operating a memory system according to an embodiment of the present disclosure.

The method of operating the memory system according to an embodiment of the present disclosure will be described with reference to FIGS. 1 to 6.

When a request for a program operation is received from the host 2000, the memory controller 1200 may output a command CMD, addresses ADD, and data DATA, which correspond to the program operation, to the memory device 1100 in response to the request from the host 2000 at step S610.

The memory device 1100 may perform the program operation in response to the command CMD, the addresses ADD, and the data DATA received from the memory controller 1200 at step S620.

For example, each of the plurality of page buffers PB1 to PBm of the read and write circuit 1130 may temporarily store the data DATA to be programmed to memory cells during the program operation, and may control the potential of a corresponding one of the bit lines BL1 to BLm in accordance with the temporarily stored data. The voltage generation unit 1140 may generate a program voltage Vpgm and a pass voltage Vpass required for the program operation. During a program operation, the address decoder 1120 may decode a row address, among the received addresses ADD, apply a program voltage Vpgm, generated by the voltage generation unit 1140, to a word line corresponding to a page selected from among a plurality of word lines WL in response to the decoded row address, and apply a pass voltage Vpass to remaining word lines, that is, unselected word lines. Thereafter, whether the program operation performed on the memory cells included in the selected page has been completed is determined by performing a program verify operation. A program-inhibit voltage (e.g., supply voltage) may be applied to bit lines corresponding to memory cells on which the program operation has been completed. A program-enable voltage (e.g., ground voltage) may be applied to bit lines corresponding to memory cells on which the program operation has not been completed, and a new program voltage Vpgm, which is generated by increasing the previous program voltage Vpgm by a step voltage, may be applied to a selected word line, and thus the program operation may be again performed. The number of pulses of the program voltage Vpgm used in the program operation may be stored in the program pulse comparison circuit 1183.

After the above-described program operation has been completed, the memory device 1100 may perform a status check operation at step S630.

The read and write circuit 1130 may check the programmed states of memory cells included in a selected page of a selected memory block during the status check operation, and may output the number of memory cells on which the program operation has failed, as fail bits, to the control logic 1160.

The check circuit 1182 may perform the status check operation in response to a first control signal C1 outputted from the internal control circuit 1181. The check circuit 1182 may count the fail bits received from the read and write circuit 1130, may determine a case where the counted number of fail bits is greater than the maximum allowable number of bits for ECC, which can be corrected using the error correction block 1210 of FIG. 1, and a case where the counted number of fail bits is less than or equal to the maximum allowable number of bits for ECC, and may then output a first sub-signal S1.

The status signal generation circuit 1185 may determine the result of the above-described status check operation, based on the first sub-signal S1 outputted from the check circuit 1182, at step S640. For example, when the counted number of fail bits is greater than the maximum allowable number of bits for ECC (in case of "fail") based on the first sub-signal S1, the status signal generation circuit 1185 may determine that a status fail occurs at step S650, and may generate and output a status signal Status corresponding thereto.

In contrast, when the counted number of fail bits is less than or equal to the maximum allowable number of bits for ECC (in case of "pass") based on the first sub-signal S1, an operation of comparing the number of program pulses may be performed at step S660. The internal control circuit 1181 outputs a second control signal C2 in response to the first sub-signal S1 outputted from the check circuit 1182. The program pulse comparison circuit 1183 may determine whether the number of program pulses that are used in the program operation performed on the selected page of the selected memory block on which the program operation has been completed, falls within or out of a preset range (e.g., range from A to B) by comparing the number of program pulses at step S670, and may generate and output the result of the determination as a second sub-signal S2.

The status signal generation circuit 1185 may determine the result of the above-described number-of-program pulses comparison operation, based on the second sub-signal S2 outputted from the program pulse comparison circuit 1183, at step S680. For example, when it is determined, based on the second sub-signal S2, that the number of program pulses that are used in the program operation performed on the selected page falls out of the preset range (e.g., range from A to B) (in case of "No"), the status signal generation circuit 1185 may determine that a status fail occurs at step S650, and may generate and output a status signal Status corresponding thereto.

Further, when it is determined, based on the second sub-signal S2, that the number of program pulses that are used in the program operation performed on the selected page falls within the preset range (e.g., range from A to B) (in case of "Yes"), the status signal generation circuit 1185 may determine that a status pass occurs at step S690, and may generate and output a status signal Status corresponding thereto.

The memory controller 1200 may update and register status information of the selected memory block in response to the status signal Status at step S700. The status information may be stored in the storage space of the memory controller 1200, for example, a buffer memory, or may be stored in any memory block of the memory device 1100.

When the program operation, the status check operation, and the number-of-program pulses comparison operation have been completed on the selected page, a next page may be selected, and then the program operation, the status check operation, and the number-of-program pulses comparison operation may be performed on the next page.

As described above, in accordance with an embodiment of the present disclosure, when the result of the status check operation is determined to be a pass after the program operation has been performed, whether the number of program pulses falls within the preset range is additionally checked, and thus a memory block having the possibility of an error occurring in the overall operation that is performed after the program operation may be effectively searched for.

FIG. 7 is a flowchart illustrating a method of operating a memory system according to an embodiment of the present disclosure.

Figure 8A:
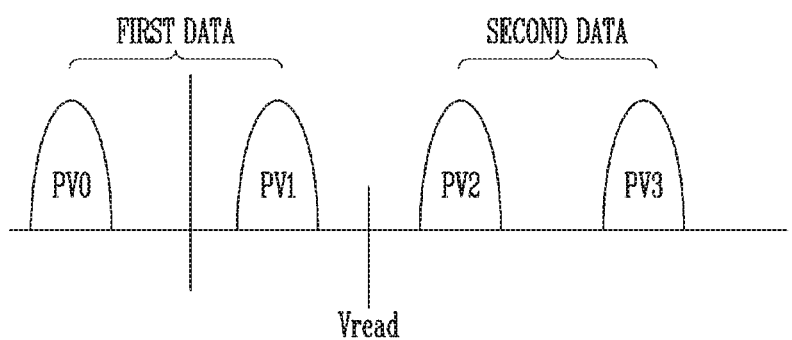
FIGS. 8A and 8B are diagrams illustrating threshold voltage distributions of memory cells for explaining a set read voltage.
Figure 8B:
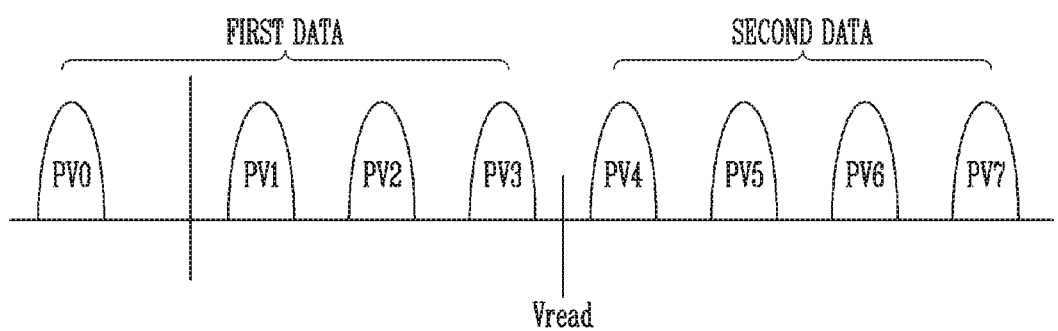

FIGS. 8A and 8B are diagrams illustrating threshold voltage distributions of memory cells for explaining a set read voltage.

A method of operating the memory system according to a present embodiment of the present disclosure will be described with reference to FIGS. 1 to 5, 7, 8A, and 8B.

When a request for a program operation is received from the host 2000, the memory controller 1200 may output a command CMD, addresses ADD, and data DATA, which correspond to the program operation, to the memory device 1100 in response to the request from the host 2000 at step S710. Further, the memory controller 1200 may randomize the data DATA received from the host 2000, and may output the randomized data to the memory device 1100. For example, when the memory device 1100 is programmed in an MLC type, the memory controller 1200 may randomize the data DATA received from the host 2000, and then convert the data DATA into random data in which first data to four data (00, 01, 10, 11) have an equal number of bits. The first data to fourth data (00, 01, 10, 11) may correspond to first to fourth programmed states PV0 to PV3, respectively, as illustrated in FIG. 8A. For example, when the memory device 1100 is programmed in a Triple-Level Cell (TLC) type, the memory controller 1200 may randomize the data DATA received from the host 2000, and may convert the data DATA into random data in which first data to eighth data (000, 001, 010, 011, 100, 101, 110, 111) have an equal number of bits. The first data to eighth data (000, 001, 010, 011, 100, 101, 110, 111) may correspond to first to eighth programmed states PV0 to PV7, respectively, as illustrated in FIG. 8B.

The memory device 1100 may perform the program operation in response to the command CMD, the addresses ADD, and the data DATA received from the memory controller 1200 at step S720. The program operation is similar to step S620 of FIG. 6, and thus a detailed description thereof will be omitted here.

After the above-described program operation has been completed, the memory device 1100 may perform a status check operation at step S730. The read and write circuit 1130 may check the programmed states of memory cells included in a selected page of a selected memory block during the status check operation, and may output the number of memory cells on which the program operation has failed, as fail bits, to the control logic 1160. The check circuit 1182 may count the fail bits received from the read and write circuit 1130, may determine a case where the counted number of fail bits is greater than the maximum allowable number of bits for ECC, which can be corrected using the error correction block 1210 of FIG. 1, and a case where the counted number of fail bits is less than or equal to the maximum allowable number of bits for ECC, and may then output a first sub-signal S1.

The status signal generation circuit 1185 may determine the result of the above-described status check operation, based on the first sub-signal S1 outputted from the check circuit 1182, at step S740. For example, when the counted number of fail bits is greater than the maximum allowable number of bits for ECC (in case of "fail") based on the first sub-signal S1, the status signal generation circuit 1185 may determine that a status fail occurs at step S750, and may generate and output a status signal Status corresponding thereto.

In contrast, when the counted number of fail bits is less than or equal to the maximum allowable number of bits for ECC (in case of "pass") based on the first sub-signal S1, an operation of comparing the number of program pulses may be performed at step S760. The internal control circuit 1181 outputs a second control signal C2 in response to the first sub-signal S1 outputted from the check circuit 1182. The program pulse comparison circuit 1183 may determine whether the number of program pulses that are used in the program operation performed on the selected page of the selected memory block on which the program operation has been completed, falls within or out of a preset range (e.g., range from A to B) by comparing the number of program pulses at step S770, and may generate and output the result of the determination as a second sub-signal S2.

The status signal generation circuit 1185 may determine the result of the above-described number-of-program pulses comparison operation, based on the second sub-signal S2 outputted from the program pulse comparison circuit 1183, at step S780. For example, when it is determined, based on the second sub-signal S2, that the number of program pulses that are used in the program operation performed on the selected page falls out of the preset range (e.g., range from A to B) (in case of "No"), the status signal generation circuit

1185 may determine that a status fail occurs at step S750, and may generate and output a status signal Status corresponding thereto.

In contrast, when it is determined, based on the second sub-signal S2, that the number of program pulses that are used in the program operation performed on the selected page falls within the preset range (e.g., range from A to B) (in case of "Yes"), an operation of comparing the number of pieces of data may be performed at step S790.

When the operation of comparing the number of pieces of data is performed at step S790, the memory device 1100 may read first data (1st DATA) and second data (2nd DATA) from the selected page using a set read voltage Vread at step S800. Here, the set read voltage Vread may be a voltage for dividing, a plurality of programmed states, as illustrated in FIGS. 8A and 8B. For example, when the memory device 1100 is programmed in an MLC type, the set read voltage Vread may be a voltage between a second programmed state PV1 and a third programmed state PV2. During the read operation, the first data (1st DATA) may be read from memory cells being in the first and second programmed states PV0 to PV1 in which the threshold voltages of the memory cells are less than the set read voltage Vread, and the second data (2nd DATA) may be read from memory cells being in the third and fourth programmed states PV2 and PV3 in which the threshold voltages of the memory cells are greater than the set read voltage Vread. Further, when the memory device 1100 is programmed in a TLC type, the set read voltage Vread may be a voltage between the fourth programmed state PV3 and a fifth programmed state PV4. During the read operation, the first data (1st DATA) may be read from memory cells being in the first to fourth programmed states PV0 to PV3 in which the threshold voltages of the memory cells are less than the set read voltage Vread, and the second data (2nd DATA) may be read from memory cells being in the fifth to eighth programmed states PV4 to PV7 in which the threshold voltages of the memory cells are greater than the set read voltage Vread. In some embodiments, the set read voltage Vread may be a voltage for dividing a plurality of programmed states into equal parts. For example, the set read voltage Vread may be a voltage for bisecting a plurality of programmed states.

The internal control circuit 1181 may output a third control signal C3 in response to the second sub-signal S2 outputted from the program pulse comparison circuit 1183. The data comparison circuit 1184 may determine whether the number of pieces of first data (1st DATA) is equal to the number of pieces of second data (2nd DATA) by comparing the number of pieces of first data with the number of pieces of second data in response to the third control signal C3 outputted from the internal control circuit 1181 at step S810, and may then generate and output a third sub-signal S3. For example, it may be determined to whether the value C of (the number of pieces of first data (1st DATA)/the number of pieces of second data (2nd DATA)) falls within a preset range (e.g., range from X to Y) (in case of "Yes") or falls out of the preset range (In case of "No"), and the third sub-signal S3 depending on the result of the determination may be generated and outputted. For example, the preset range may be a range from ⅔ to ½.

The status signal generation circuit 1185 determines the result of the above-described number-of-pieces of data comparison operation, based on the third sub-signal S3 outputted from the data comparison circuit 1184. For example, when it is determined, based on the third sub-signal S3, that the value C of (the number of pieces of first data (1st DATA)/the number of pieces of second data (2nd DATA)) falls out of the preset range (e.g., range from X to Y) (in case of "No"), the status signal generation circuit 1185 may determine that a status fail occurs at step S750, and may generate and output a status signal Status corresponding thereto.

In contrast, when it is determined, based on the third sub-signal S3, that the value C of (the number of pieces of first data (1st DATA)/the number of pieces of second data (2nd DATA)) falls within the preset range (e.g., range from X to Y) (in case of "Yes"), the status signal generation circuit 1185 may determine that a status pass occurs at step S820, and may generate and output a status signal Status corresponding thereto.

The memory controller 1200 may update and register the status information of the selected memory block in response to the status signal Status at step S830. The status information may be stored in the storage space of the memory controller 1200, for example, a buffer memory, or may be stored in any memory block of the memory device 1100.

When the program operation, the status check operation, the number-of-program pulses comparison operation, and the number-of-pieces of data comparison operation have been completed on the selected page, a next page may be selected, and then the program operation, the status check operation, the number-of-program pulses comparison operation, and the number-of-pieces of data comparison operation may be performed on the next page.

As described above, in accordance with an embodiment of the present disclosure, when the result of the status check operation is determined to be a pass after the program operation has been performed, whether the number of program pulses falls within a preset range and whether pieces of program data are uniformly distributed may be additionally checked, and thus a memory block having the possibility of an error occurring in the overall operation that is performed after the program operation, may be effectively searched for.

Figure 9:
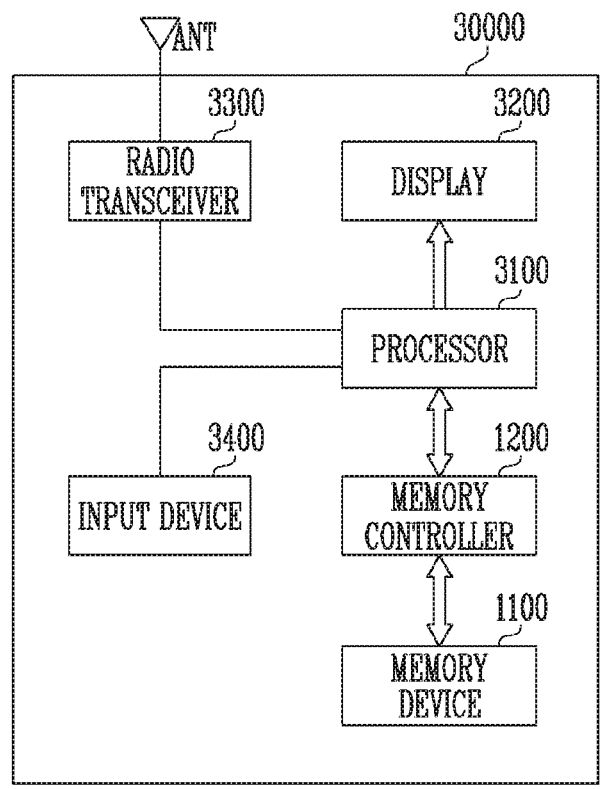
FIG. 9 is a diagram illustrating an embodiment of a memory system.

FIG. 9 is a diagram illustrating an embodiment of a memory system.

Referring to FIG. 9, a memory system 30000 may be embodied in a cellular phone, a smartphone, a tablet PC, a personal digital assistant (PDA) or a wireless communication device. The memory system 30000 may include the memory device 1100 and a memory controller 1200 capable of controlling the operation of the memory device 1100. The memory controller 1200 may control a data access operation, e.g., a program, erase, or read operation, of the memory device 1100 under the control of a processor 3100.

Data programmed in the memory device 1100 may be outputted through a display 3200 under the control of the memory controller 1200.

A radio transceiver 3300 may send and receive radio signals through an antenna ANT. For example, the radio transceiver 3300 may change a radio signal received through the antenna ANT into a signal which may be processed by the processor 3100. Therefore, the processor 3100 may process a signal outputted from the radio transceiver 3300 and transmit the processed signal to the memory controller 1200 or the display 3200. The memory controller 1200 may program a signal processed by the processor 3100 to the memory device 1100. Furthermore, the radio transceiver 3300 may change a signal outputted from the processor 3100 into a radio signal, and output the changed radio signal to the external device through the antenna ANT. An input device 3400 may be used to input a control signal for controlling the operation of the processor 3100 or data to be processed by the processor 3100. The input device 3400 may be implemented as a pointing device such as a touch pad or a computer mouse, a keypad or a keyboard. The processor 3100 may control the operation of the display 3200 such that data outputted from the memory controller 1200, data from the radio transceiver 3300 or data from the input device 3400 is outputted through the display 3200.

In an embodiment, the memory controller 1200 capable of controlling the operation of the memory device 1100 may be implemented as a part of the processor 3100 or a chip provided separately from the processor 3100. Further, the memory controller 1200 may be implemented through the example of the memory controller illustrated in FIG. 1, and the memory device 1100 may be implemented through the example of the memory device illustrated in FIG. 1.

Figure 10:
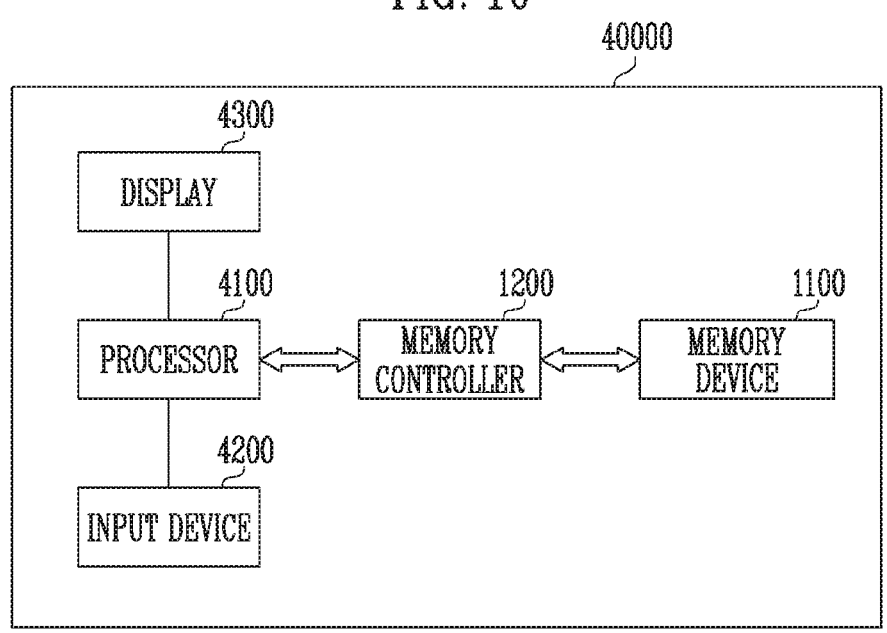
FIG. 10 is a diagram illustrating an embodiment of a memory system.

FIG. 10 is a diagram illustrating an embodiment of a memory system.

Referring to FIG. 10, a memory system 40000 may be embodied in a personal computer, a tablet PC, a net-book, an e-reader, a personal digital assistant (PDA), a portable multimedia player (PMP), an MP3 player, or an MP4 player.

The memory system 40000 may include the memory device 1100 and a memory controller 1200 capable of controlling the data processing operation of the memory device 1100.

A processor 4100 may output data stored in the memory device 1100 through a display 4300, according to data inputted from an input device 4200. For example, the input device 4200 may be implemented as a point device such as a touch pad or a computer mouse, a keypad or a keyboard.

The processor 4100 may control the overall operation of the memory system 40000 and control the operation of the memory controller 1200. In an embodiment, the memory controller 1200 capable of controlling the operation of the memory device 1100 may be implemented as a part of the processor 4100 or a chip provided separately from the processor 4100. Further, the memory controller 1200 may be implemented through the example of the memory controller illustrated in FIG. 1, and the memory device 1100 may be implemented through the example of the memory device illustrated in FIG. 1.

Figure 11:
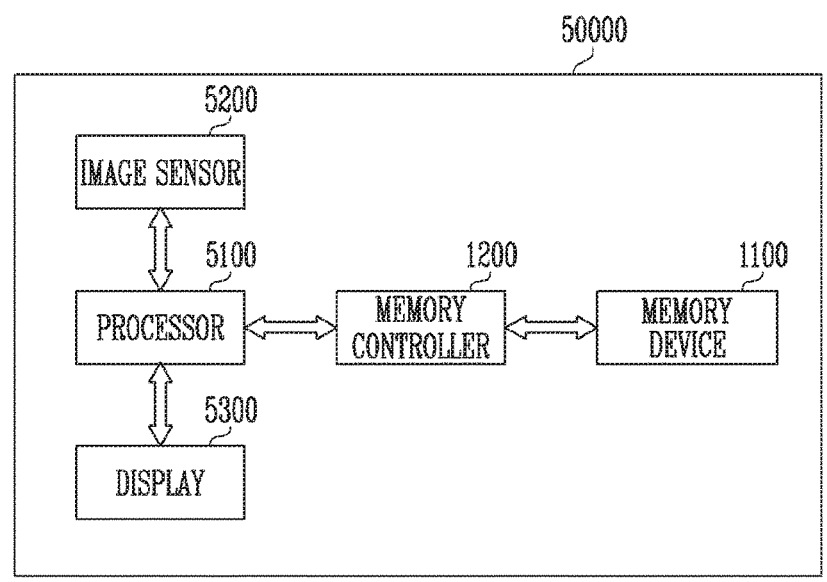
FIG. 11 is a diagram illustrating an embodiment of a memory system.

FIG. 11 is a diagram illustrating an embodiment of a memory system.

Referring to FIG. 11, a memory system 50000 may be embodied in an image processing device, e.g., a digital camera, a portable phone provided with a digital camera, a smartphone provided with a digital camera, or a tablet PC provided with a digital camera.

The memory system 50000 may include the memory device 1100 and a memory controller 1200 capable of controlling a data processing operation, e.g., a program, erase, or read operation, of the memory device 1100.

An image sensor 5200 of the memory system 50000 may convert an optical image into digital signals. The converted digital signals may be transmitted to a processor 5100 or the memory controller 1200. Under the control of the processor 5100, the converted digital signals may be outputted through a display 5300 or stored in the memory device 1100 through the memory controller 1200. Data stored in the memory device 1100 may be outputted through the display 5300 under the control of the processor 5100 or the memory controller 1200.

In an embodiment, the memory controller 1200 capable of controlling the operation of the memory device 1100 may be implemented as a part of the processor 5100, or a chip provided separately from the processor 5100. Further, the memory controller 1200 may be implemented through the example of the memory controller illustrated in FIG. 1, and the memory device 1100 may be implemented through the example of the memory device illustrated in FIG. 1.

Figure 12:
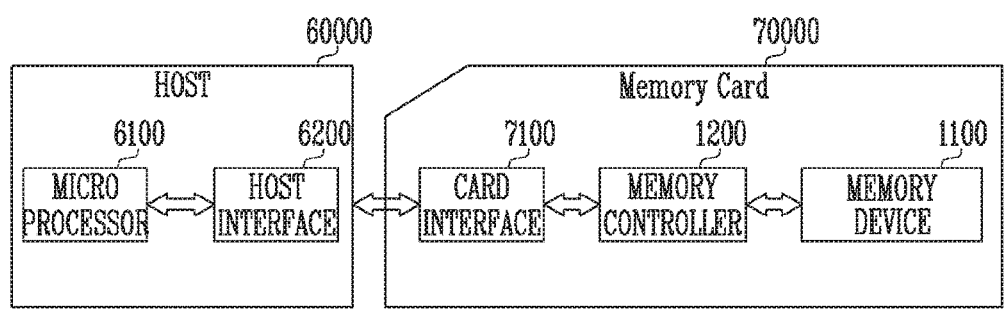
FIG. 12 is a diagram illustrating an embodiment of a memory system.

FIG. 12 is a diagram illustrating an embodiment of a memory system.

Referring to FIG. 12, a memory system 70000 may be embodied in a memory card or a smart card. The memory system 70000 may include the memory device 1100, a memory controller 1200 and a card interface 7100.

The memory controller 1200 may control data exchange between the memory device 1100 and the card interface 7100. In an embodiment, the card interface 7100 may be a secure digital (SD) card interface or a multi-media card (MMC) interface, but it is not limited thereto.

The card interface 7100 may interface data exchange between a host 60000 and the memory controller 1200 according to a protocol of the host 60000. In an embodiment, the card interface 7100 may support a universal serial bus (USB) protocol, and an inter-chip (IC)-USB protocol. Here, the card interface may refer to hardware capable of supporting a protocol which is used by the host 60000, software installed in the hardware, or a signal transmission method.

When the memory system 70000 is coupled to a host interface 6200 of the host 60000 such as a PC, a tablet PC, a digital camera, a digital audio player, a cellular phone, console video game hardware or a digital set-top box, the host interface 6200 may perform data communication with the memory device 1100 through the card interface 7100 and the memory controller 1200 under the control of a microprocessor 6100. Further, the memory controller 1200 may be implemented through the example of the memory controller illustrated in FIG. 1, and the memory device 1100 may be implemented through the example of the memory device illustrated in FIG. 1.

In accordance with a present disclosure, the result of a final status check may be determined using the number of program pulses used in a program operation, and thus errors that may occur in overall operations after the program operation may be suppressed.

The above-described examples of embodiments are merely for the purpose of understanding the technical spirit of the present disclosure and the scope of the present disclosure should not be limited to the above-described examples of embodiments. It will be obvious to those skilled in the art to which the present disclosure pertains that other modifications based on the technical spirit of the present disclosure may be made in addition to the above-described examples of embodiments.

Unless otherwise defined, all terms including technical and scientific terms used herein have the same meaning as commonly understood by one of ordinary skill in the art to which the present disclosure belongs. Unless otherwise defined in the present disclosure, the terms should not be construed as being ideal or excessively formal.

What is claimed is:

1. A memory device, comprising:
   a memory cell array configured to store data;
   a peripheral circuit configured to perform a program operation on the memory cell array; and
   a control logic configured to perform the program operation by controlling the peripheral circuit and to perform a status check operation after the program operation,
   wherein the control logic is configured to, based on a determination that the status check operation has passed, perform a number-of-program pulses comparison operation by comparing a number of program pulses used in the program operation to a first preset range.

2. The memory device according to claim 1, wherein the control logic is configured to generate and output a status signal based on a result of the number-of-program pulses comparison operation.

3. The memory device according to claim 2, wherein the control logic is configured to, when the number of program pulses is determined to be within the first preset range as a result of the number-of-program pulses comparison operation, perform a number-of-pieces of data comparison operation of comparing a number of pieces of first data with a number of pieces of second data, wherein the first and second data are programmed to the memory cell array.

4. The memory device according to claim 3, wherein:
the first data and the second data are read from the memory cell array using a set read voltage, and
the set read voltage is a read voltage for dividing a plurality of programmed states in which data is programmed to the memory cell array.

5. The memory device according to claim 3, wherein the control logic comprises:
an overall operation control circuit configured to control the peripheral circuit such that the program operation is performed; and
a status circuit configured to perform the status check operation, the number-of- program pulses comparison operation, and the number-of-pieces of data comparison operation.

6. The memory device according to claim 5, wherein the status circuit comprises:
an internal control circuit configured to generate a first control signal, a second control signal and a third control signal;
a check circuit configured to count a number of fail bits obtained as a result of the status check operation in response to the first control signal, and generate a first sub-signal by comparing the counted number of fail bits with a maximum allowable number of bits for error checking and correcting or error correcting code (ECC);
a program pulse comparison circuit configured to determine whether the number of program pulses are within or out of the first preset range in response to the second control signal, and then generate a second sub-signal;
a data comparison circuit configured to determine whether a ratio of the number of pieces of first data to the number of pieces of second data is within or out of a second preset range in response to the third control signal, and then generate a third sub-signal; and
a status signal generation circuit configured to generate and output the status signal based on the first to third sub-signals.

7. The memory device according to claim 6, wherein the peripheral circuit is configured to output a number of memory cells on which the program operation has failed, among memory cells included in the memory cell array, as the fail bits, to the check circuit during the status check operation.

8. The memory device according to claim 6, wherein the status signal generation circuit is configured to generate and output the status signal corresponding to a status pass when a result of the status check operation is determined to be a pass, when the number of program pulses is determined to be within the first preset range as a result of the number-of-program pulses comparison operation, and when the ratio of the number of pieces of first data to the number of pieces of second data is determined to be within the second preset range as a result of the number-of-pieces of data comparison operation.

9. A memory system, comprising:
a memory device configured to perform a program operation and a status check operation; and
a memory controller configured to control the program operation of the memory device and to receive status information pertaining to the program operation,
wherein the memory device is configured to, based on a determination that the status check operation has passed, perform a number-of-program pulses comparison operation by comparing a number of program pulses used in the program operation to a first preset range.

10. The memory system according to claim 9,
wherein the memory device generates and outputs a status signal including the status information after the program operation is performed,
wherein the memory controller receives the status signal and then stores the status information, and
wherein the memory device generates the status signal by performing the status check operation, the number-of-program pulses comparison operation, and a number-of-pieces of data comparison operation for the program operation.

11. The memory system according to claim 10, wherein the memory device comprises:
a memory cell array configured to store data;
a peripheral circuit configured to perform the program operation on the memory cell array; and
a control logic configured to control the peripheral circuit, and thereafter generate and output the status signal by performing the status check operation, the number-of-program pulses comparison operation, and the number-of-pieces of data comparison operation.

12. The memory system according to claim 11, wherein the control logic comprises:
an overall operation control circuit configured to control the peripheral circuit such that the program operation is performed; and
a status circuit configured to perform the status check operation, the number-of-program pulses comparison operation, and the number-of-pieces of data comparison operation.

13. The memory system according to claim 12, wherein the status circuit comprises:
an internal control circuit configured to generate a first control signal, a second control signal and a third control signal;
a check circuit configured to count a number of fail bits obtained as a result of the status check operation in response to the first control signal, and generate a first sub-signal by comparing the counted number of fail bits with a maximum allowable number of bits for error checking and correcting or error correcting code (ECC);
a program pulse comparison circuit configured to determine whether the number of program pulses is within or out of the first preset range in response to the second control signal, and then generate a second sub-signal;
a data comparison circuit configured to determine whether a ratio of a number of pieces of first data to a number of pieces of second data is within or out of a second preset range in response to the third control signal, and then generate a third sub-signal; and a status signal generation circuit configured to generate and output the status signal based on the first to third sub-signals.

14. The memory system according to claim 13, wherein the status signal generation circuit is configured to generate and output the status signal corresponding to a status pass when a result of the status check operation is determined to be a pass, when the number of program pulses is determined to be within the first preset range as a result of the number-of-program pulses comparison operation, and when the ratio of the number of pieces of first data to the number of pieces of second data is determined to be within the second preset range as a result of the number-of-pieces of data comparison operation.

15. A method of operating a memory device, comprising:
performing a program operation;
performing a status check operation for the program operation; and
performing a number-of-program pulses comparison operation of, when a result of the status check operation is determined to be a pass, determining whether a number of program pulses used in the program operation is within or out of a first preset range.

16. The method according to claim 15, wherein, when the number of program pulses is determined to be within the first preset range as a result of the number-of-program pulses comparison operation, a status signal corresponding to a status pass is generated and outputted, whereas when the number of program pulses are out of the first preset range, a status signal corresponding to a status fail is generated and outputted.

17. The method according to claim 15, further comprising:
when the number of program pulses are within the first preset range as a result of the number-of-program pulses comparison operation, performing a read operation using a set voltage; and
performing a number-of-pieces of data comparison operation of comparing a number of pieces of first data with a number of pieces of second data, wherein the first and second data are read as a result of the read operation.

18. The method according to claim 17, wherein, when a ratio of the number of pieces of first data to the number of pieces of second data are within a second preset range, a status signal corresponding to a status pass is generated and outputted, whereas when the ratio of the number of pieces of first data to the number of pieces of second data are out of the second preset range, a status signal corresponding to a status fail is generated and outputted.

19. The method according to claim 17, wherein the set voltage is a voltage for dividing a plurality of programmed states in which data is programmed during the program operation.

20. The method according to claim 15, wherein the status check operation is an operation of comparing a number of memory cells, determined to have failed after the program operation, with a maximum allowable number of bits for error checking and correcting or error correcting code (ECC).

* * * * *